(12) United States Patent
Eguchi et al.

(10) Patent No.: US 10,960,999 B2
(45) Date of Patent: Mar. 30, 2021

(54) COMPONENT MOUNTING SYSTEM (71) Applicant: Panasonic Intellectual Property Management Co., Ltd., Osaka (JP)

(72) Inventors: Ryouji Eguchi, Fukuoka (JP); Yasuo Oku, Fukuoka (JP); Kazunori Kanai, Fukuoka (JP); Hiroki Kobayashi, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 6 days.

(21) Appl. No.: 15/784,346

(22) Filed: Oct. 16, 2017

(65) Prior Publication Data

US 2018/0118387 A1 May 3, 2018

(30) Foreign Application Priority Data

Oct. 28, 2016 (JP) .............................. JP2016-211260

(51) Int. Cl.
*B65B 15/04* (2006.01)
*H05K 13/02* (2006.01)
(Continued)

(52) U.S. Cl.
CPC ......... *B65B 15/04* (2013.01); *B65H 19/1852* (2013.01); *B65H 26/08* (2013.01); *H05K 13/0215* (2018.08); *H05K 13/0419* (2018.08); *B65H 2301/4606* (2013.01); *B65H 2301/4631* (2013.01); *B65H 2301/46222* (2013.01)

(58) Field of Classification Search
CPC ............ H05K 13/0419; B65H 23/1806; B65H 2301/4631
See application file for complete search history.

(56) References Cited

U.S. PATENT DOCUMENTS 6,157,870 A * 12/2000 Gfeller .................. B23P 19/001
700/231
6,887,330 B2 * 5/2005 Onoshiro ........... H05K 13/0417
156/159
(Continued)

FOREIGN PATENT DOCUMENTS

JP   2014-089999 A   5/2014
JP   2015-115412 A   6/2015

*Primary Examiner* — Gene O Crawford
*Assistant Examiner* — Kelvin L Randall, Jr.
(74) *Attorney, Agent, or Firm* — Pearne & Gordon LLP (57) ABSTRACT There is provided a component mounter including: a storage which stores information related to a tape feeder and information related to a carrier tape pitch-fed by the tape feeder; a detector which detects a state where the carrier tape becomes close to a component shortage; a determiner which determines whether to perform predetermined processing with respect to a termination portion of the carrier tape based on information related to the tape feeder and information related to the carrier tape which are stored in the storage, in a case where a state where the carrier tape is close to a component shortage is detected by the detector; and a notifier which notifies an operator of contents of the predetermined processing, in a case where the determiner determines that the predetermined processing is supposed to be performed with respect to the termination portion of the carrier tape.

5 Claims, 11 Drawing Sheets (51) Int. Cl.
  *B65H 19/18*  (2006.01)
  *H05K 13/04*  (2006.01)
  *B65H 26/08*  (2006.01)

(56) References Cited

U.S. PATENT DOCUMENTS

| | | | | |
|---|---|---|---|---|
| 6,901,658 | B2* | 6/2005 | Ohashi | H05K 13/0417 29/832 |
| 7,220,095 | B2* | 5/2007 | Lyndaker | H05K 13/0419 414/810 |
| 7,850,040 | B2* | 12/2010 | Davis | H05K 13/0419 221/72 |
| 8,063,783 | B2* | 11/2011 | Miyashita | G06K 17/0025 340/572.1 |
| 9,743,569 | B2* | 8/2017 | Matsumori | H05K 13/0417 |
| 10,112,418 | B2* | 10/2018 | Matsumori | B41J 13/0009 |
| 2003/0219330 | A1* | 11/2003 | Lyndaker | H05K 13/0419 414/411 |
| 2008/0003043 | A1* | 1/2008 | Fukui | B41J 11/46 400/615.2 |
| 2008/0093375 | A1* | 4/2008 | Davis | H05K 13/0419 221/72 |
| 2009/0033021 | A1* | 2/2009 | Moriyama | B41J 3/50 271/8.1 |
| 2010/0239401 | A1* | 9/2010 | Kim | B65H 37/002 414/412 |
| 2016/0194171 | A1* | 7/2016 | Matsumori | H05K 13/0419 226/91 |
| 2016/0198595 | A1* | 7/2016 | Matsumori | B65H 20/20 221/13 |
| 2016/0198598 | A1* | 7/2016 | Matsumori | H05K 13/0417 226/1 |
| 2018/0046736 | A1* | 2/2018 | Sugimoto et al. | G06F 17/5009 703/1 |
| 2018/0111775 | A1* | 4/2018 | Chi | B65H 19/18 |
| 2019/0098807 | A1* | 3/2019 | Kobayashi | H05K 13/0215 |

* cited by examiner

Advancing direction of carrier tape

FIG. 3B

Advancing direction of carrier tape

FIG. 4A

Advancing direction of carrier tape

FIG. 4B

Advancing direction of carrier tape

| Type of carrier tape | Type of tape feeder | Shape of termination portion | Fixing to reel | Termination processing notification |
|---|---|---|---|---|
| A | Manual | Orthogonal | Non-fixing | Necessary |
| B | Auto | Orthogonal | Fixing | Necessary |
| C | Auto | Oblique | Fixing | Necessary |
| D | Auto | Orthogonal | Non-fixing | Unnecessary |

FIG. 11

COMPONENT MOUNTING SYSTEM

BACKGROUND

1. Technical Field

The disclosure relates to a component mounting system including a tape feeder that pitch-feeds a carrier tape and supplies components.

2. Description of Related Art

In the related art, a component mounting system which manufactures a mounting board in which components are mounted on a board is known, and as a component supply device in the component mounting system, a tape feeder which pitch-feeds a carrier tape and supplies components to a predetermined position is frequently used. In the tape feeder, when the carrier tape (referred to as a previous tape) which is currently being pitch-fed becomes close to a component shortage, a tip head portion of the following carrier tape (referred to as a following tape) is connected to a termination portion of the previous tape by a splicing tape, and replenishment of the carrier tape (that is, component) is performed (for example, Japanese Patent Unexamined Publication No. 2014-89999).

In addition, as one type of such a tape feeder, an auto load type tape feeder which is loaded as the carrier tape is automatically drawn into when inserting the carrier tape into a tape inlet is known (for example, Japanese Patent Unexamined Publication No. 2015-115412). The auto load type tape feeder can also be used as a so-called splicingless feeder since the following tape is automatically drawn into the tape feeder subsequently to the termination portion of the previous tape when inserting the following tape into the tape inlet when the previous tape becomes close to a component shortage.

SUMMARY

There is provided a component mounting system of the disclosure including a tape feeder that pitch-feeds a carrier tape and supplies components, including: a storage which stores information related to the tape feeder and information related to the carrier tape pitch-fed by the tape feeder; a detector which detects a state where the carrier tape pitch-fed by the tape feeder becomes close to a component shortage; a determiner which determines whether to perform predetermined processing with respect to a termination portion of the carrier tape to be pitch-fed by the tape feeder based on information related to the tape feeder and information related to the carrier tape which are stored in the storage, in a case where a state where the carrier tape pitch-fed by the tape feeder is close to a component shortage is detected by the detector; and a notifier which notifies an operator of contents of the predetermined processing, in a case where the determiner determines that the predetermined processing is supposed to be performed with respect to the termination portion of the carrier tape.

According to the disclosure, it is possible to reduce a workload of an operator with respect to termination processing of a carrier tape.

DETAILED DESCRIPTIONS

Before describing exemplary embodiments, a problem in the related art will be briefly described.

In a tape feeder described in Japanese Patent Unexamined Publication No. 2014-89999 and in Japanese Patent Unexamined Publication No. 2015-115412, the inventors of the specification have recognized that there is a case where it becomes necessary to perform predetermined termination processing with respect to a previous tape in a case where the previous tape becomes close to a component shortage and a following tape is replenished. Here, the termination processing is processing for smoothly performing replenishment of the following tape, and specifically indicates cutting work and fixing releasing work of the previous tape. In addition, the cutting work is work of performing cutting such that a part of an appropriate location of the previous tape has an orthogonal shape in a case where the shape of a termination portion of the previous tape is not a linear shape (referred to as an orthogonal shape) orthogonal to a direction in which the previous tape extends. In addition, the fixing releasing work is work of releasing the fixing and separating the termination portion of the previous tape from a shaft portion of a reel in a case where the termination portion of the previous tape is fixed to the shaft portion of the reel by an adhesive tape or the like.

However, as described above, when performing the replenishment of the following tape, there is a case where an operator him or herself determines which termination processing is supposed to be performed with respect to the previous tape, and there is a problem that there is a concern that a workload of the operator excessively increases.

Here, an object of the disclosure is to provide a component mounting system which can reduce the workload of the operator with respect to the termination processing of the carrier tape.

Figure 1:
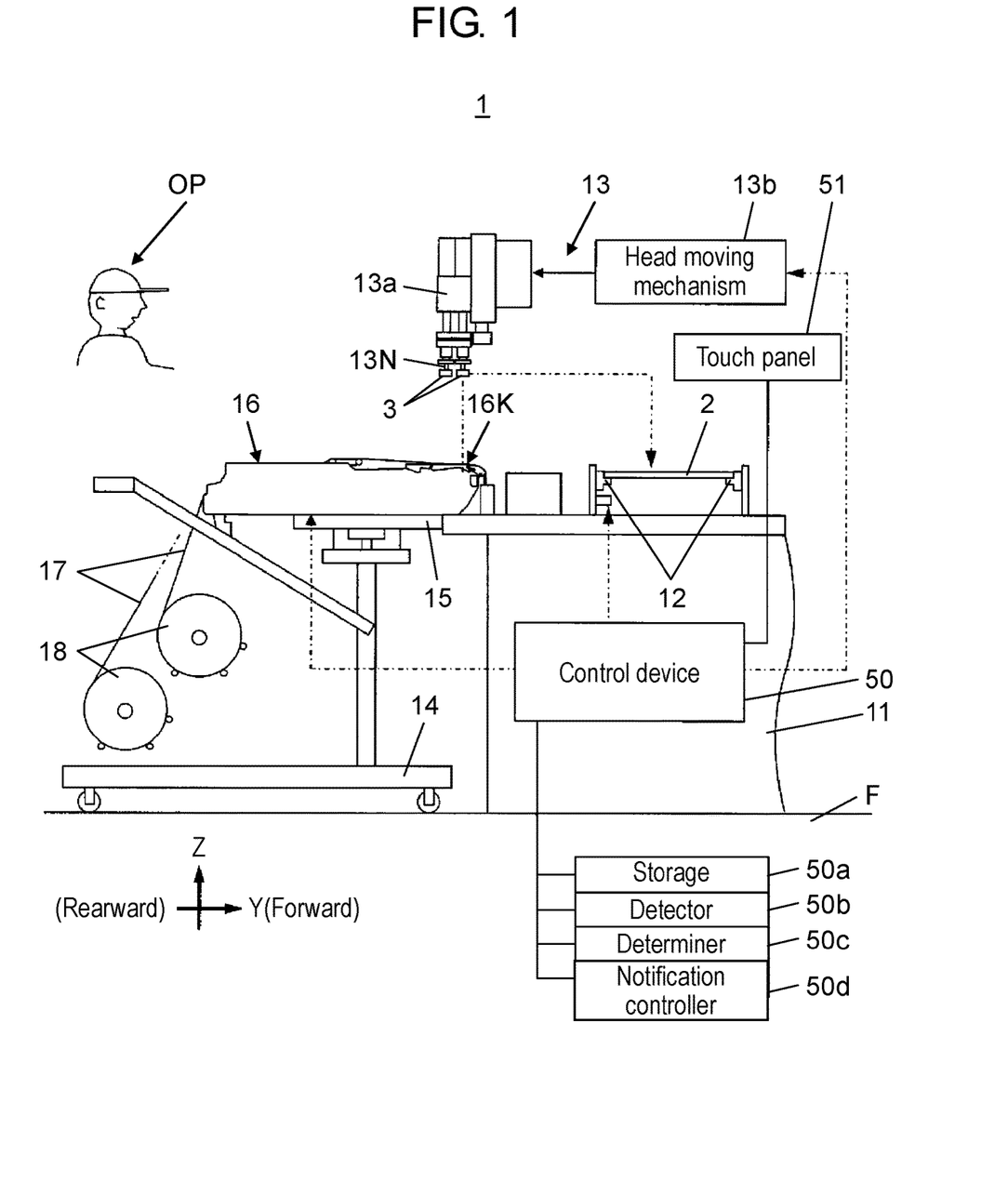
FIG. 1 is a side view of a component mounter in one exemplary embodiment of the disclosure.

Hereinafter, exemplary embodiments of the disclosure will be described with reference to the drawings. Component mounter 1 illustrated in FIG. 1 illustrates one aspect of the component mounting system which mounts component 3 on board 2, and includes conveyor 12 and component transfer mechanism 13 on base 11. Feeder base 15 attached to carriage 14 is linked to base 11, and tape feeder 16 is attached to feeder base 15. In the exemplary embodiment, a leftward-and-rightward direction (direction orthogonal to a paper surface of FIG. 1) viewed from operator OP is an X-axis direction, and a forward-and-rearward direction (leftward-and-rightward direction of the paper surface of FIG. 1) viewed from operator OP is a Y-axis direction. In addition, an upward-and-downward direction (upward-and-downward direction of the paper surface of FIG. 1) is a Z-axis direction.

Figure 2A:
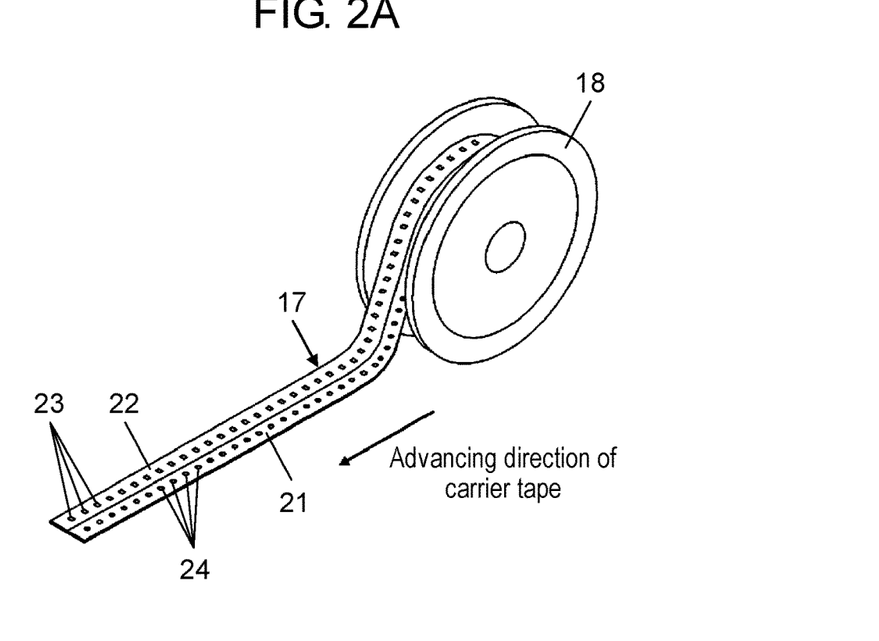
FIG. 2A is a perspective view illustrating a carrier tape pitch-fed by a tape feeder included in the component mounter in one exemplary embodiment of the disclosure together with a reel.
Figure 2B:
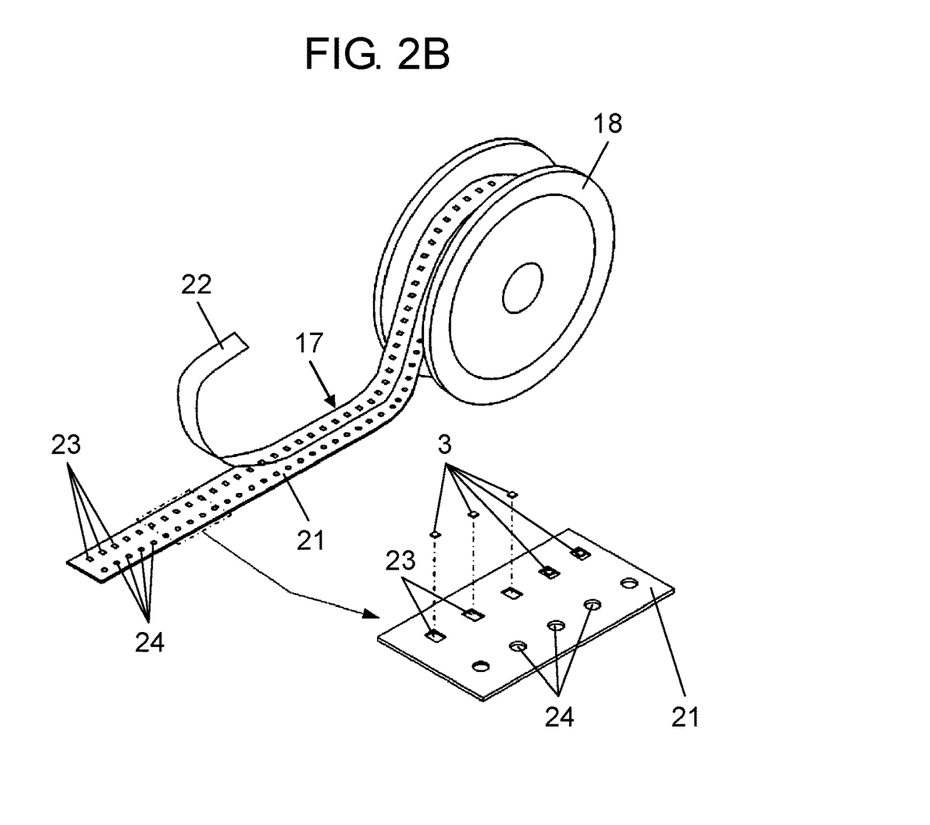
FIG. 2B is a perspective view illustrating the carrier tape pitch-fed by the tape feeder included in the component mounter in one exemplary embodiment of the disclosure together with the reel.
Figure 3A:
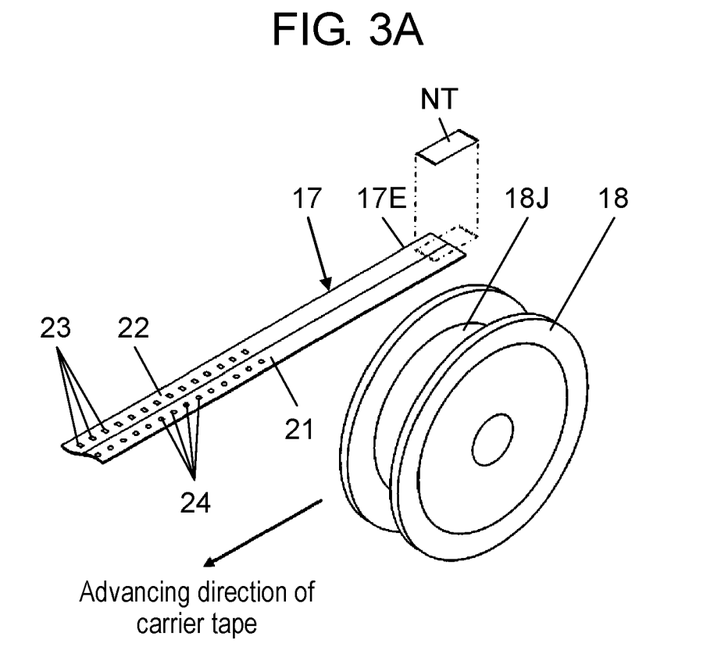
FIG. 3A is a perspective view illustrating the carrier tape pitch-fed by the tape feeder included in the component mounter in one exemplary embodiment of the disclosure together with the reel.
Figure 3B:
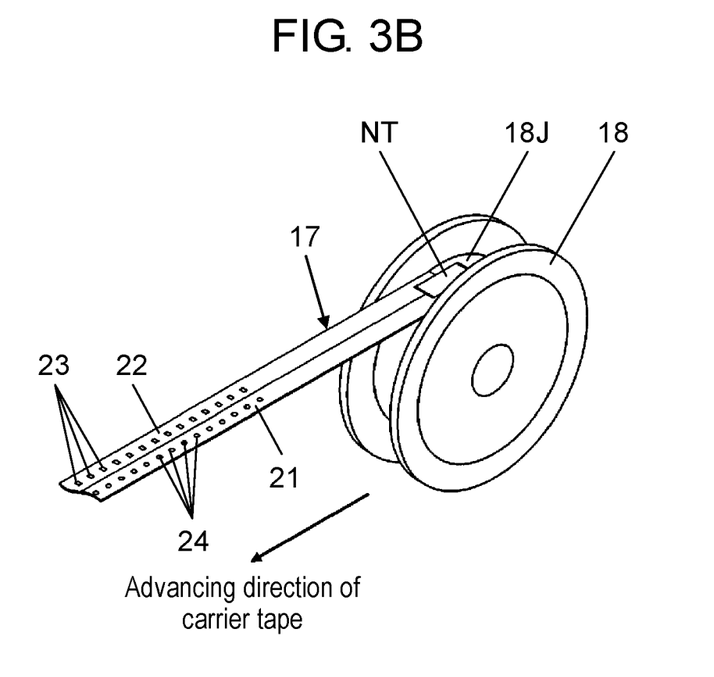
FIG. 3B is a perspective view illustrating the carrier tape pitch-fed by the tape feeder included in the component mounter in one exemplary embodiment of the disclosure together with the reel.

In FIG. 1, conveyor 12 functions as a board transporter, and transports board 2 in the X-axis direction and positions board 2 at a work position. Component transfer mechanism 13 includes transfer head 13*a* and head moving mechanism 13*b*. Transfer head 13*a* includes a plurality of suction nozzles 13N which extend downward. Feeder base 15 moves on floor surface F by carriage 14, and is linked to an end portion at a rear part (near part viewed from operator OP) of base 11. A plurality of tape feeders 16 are attached to feeder base 15 to be aligned in the X-axis direction, and as operator OP links carriage 14 to base 11, it is possible to collectively mount a plurality of tape feeders 16 on base 11. Tape feeder 16 intermittently supplies component 3 to component supply port 16K positioned in the end portion at a front part (far side viewed from operator OP) by pitch-feeding carrier tape 17 in which multiple components 3 are accommodated to be aligned in one row. As illustrated in FIGS. 2A and 2B, carrier tape 17 is configured of base tape 21 and transparent cover tape 22 which sticks to an upper surface of base tape 21. In base tape 21, multiple recessed component accommodation portions 23 are intermittently provided in one row at an equivalent interval in a longitudinal direction of base tape 21.

In FIG. 2B, components 3 are accommodated in each of component accommodation portions 23. Each of component accommodation portions 23 is covered with cover tape 22, and accordingly, component 3 is prevented from falling out from component accommodation portion 23. At a position parallel to the row of component accommodation portion 23 of base tape 21, multiple feed holes 24 are provided in one row at an equivalent interval. Reel 18 (FIGS. 2A and 2B) around which carrier tape 17 is wound is held on carriage 14 (FIG. 1), and carrier tape 17 is drawn out from reel 18 and fills tape feeder 16.

Figure 4A:
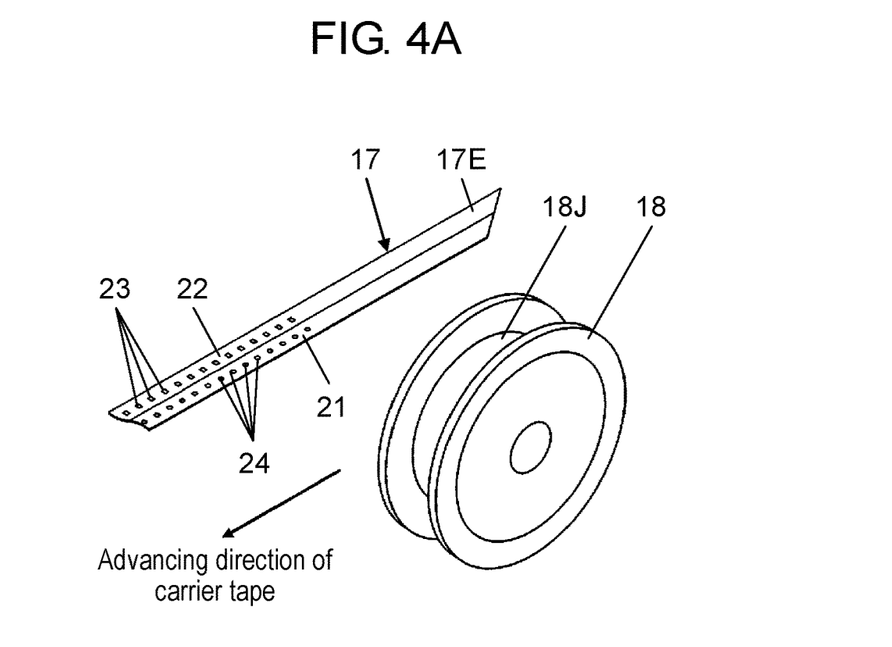
FIG. 4A is a perspective view illustrating the carrier tape pitch-fed by the tape feeder included in the component mounter in one exemplary embodiment of the disclosure together with the reel.
Figure 4B:
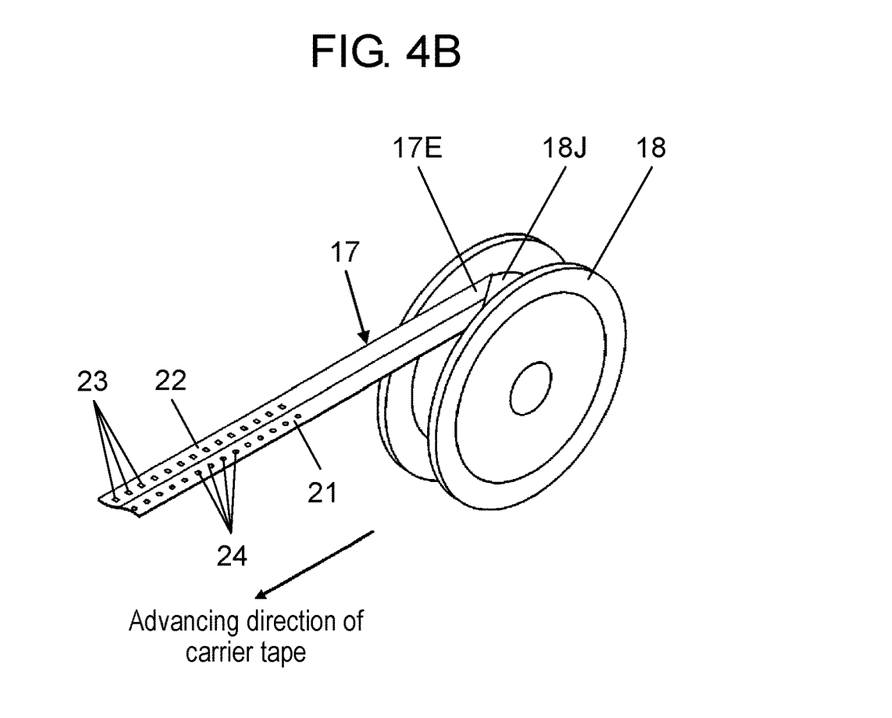
FIG. 4B is a perspective view illustrating the carrier tape pitch-fed by the tape feeder included in the component mounter in one exemplary embodiment of the disclosure together with the reel.
Figure 5A:
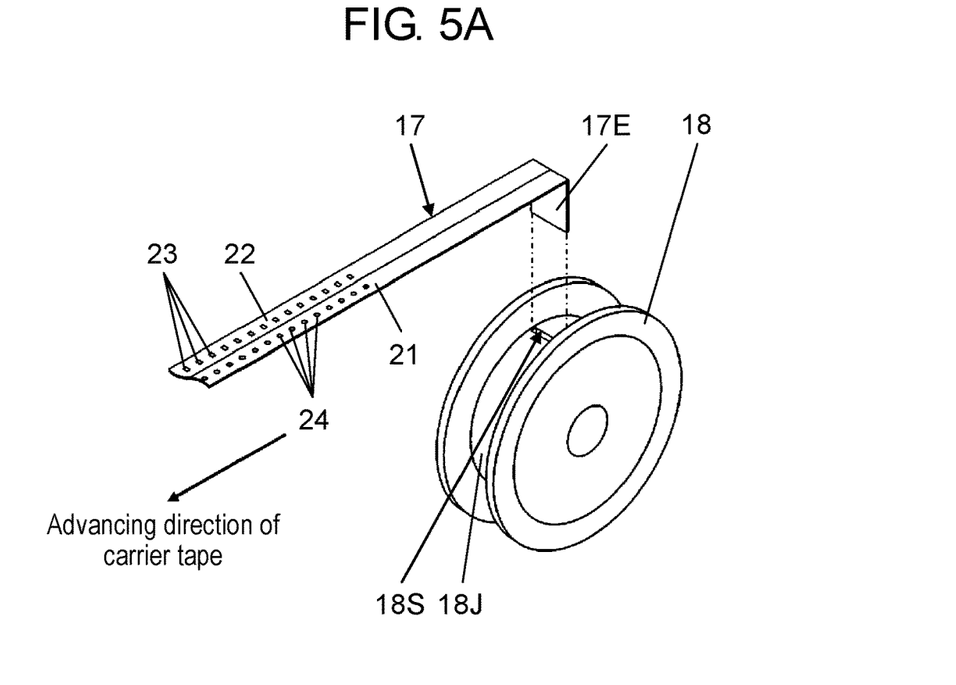
FIG. 5A is a perspective view illustrating the carrier tape pitch-fed by the tape feeder included in the component mounter in one exemplary embodiment of the disclosure together with the reel.
Figure 5B:
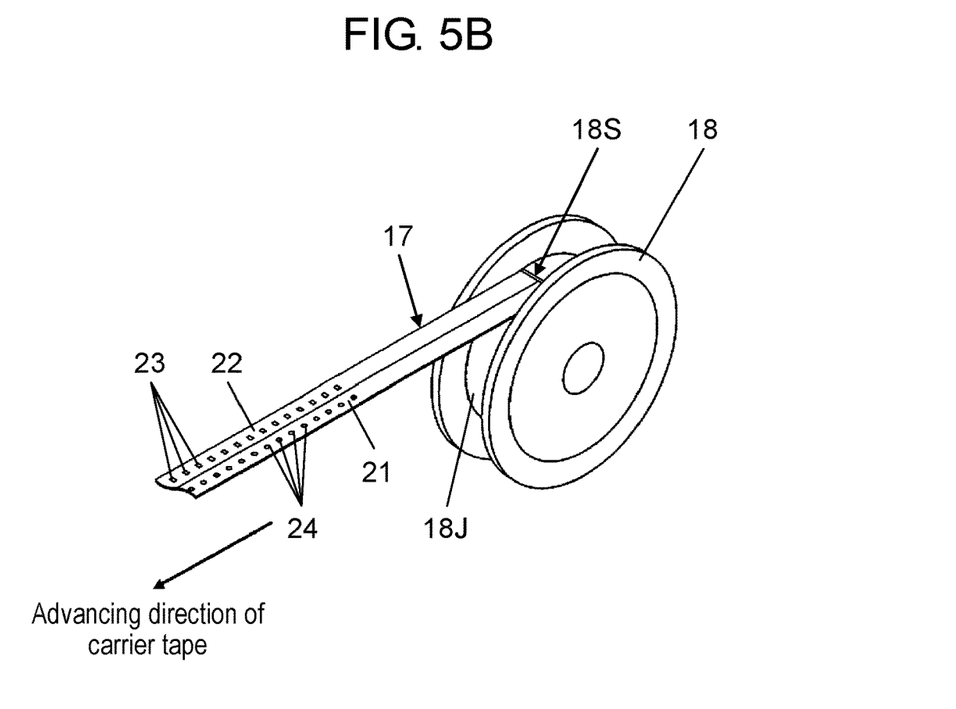
FIG. 5B is a perspective view illustrating the carrier tape pitch-fed by the tape feeder included in the component mounter in one exemplary embodiment of the disclosure together with the reel.

As illustrated in FIGS. 3A, 3B, 4A, 4B, 5A, and 5B, the shape of termination portion (end portion on a side wound around reel 18) 17E of carrier tape 17 or a fixing circumstance with respect to reel 18 respectively varies according to the type or the like of carrier tape 17. For example, in addition to a case where the shape of termination portion 17E is a linear shape (referred to as an orthogonal shape) orthogonal to a direction in which carrier tape 17 extends (FIGS. 3A and 3B), there is also a case where the shape of termination portion 17E is a linear shape (referred to as an oblique shape) which obliquely extends in the direction in which carrier tape 17 extends (FIGS. 4A and 4B).

In addition to a case where termination portion 17E of carrier tape 17 is fixed to reel 18 as termination portion 17E of carrier tape 17 sticks to an outer circumferential surface of shaft portion 18J of reel 18 by adhesive tape NT or the like (FIGS. 3A and 3B), or is inserted into slit portion 18S provided to be open to a part of the outer circumferential surface of shaft portion 18J of reel 18, or the like (FIGS. 5A and 5B), there is a case where a non-fixing state where termination portion 17E is not fixed to reel 18 is achieved (FIGS. 4A and 4B).

Examples of tape feeder 16 used in component mounter 1 of the exemplary embodiment include manual load type tape feeder 16 (hereinafter, referred to as manual load feeder 16A) illustrated in FIG. 6, and auto load type tape feeder 16 (hereinafter, referred to as auto load feeder 16B) illustrated in FIG. 7. Any type of tape feeder 16 also includes main body portion 31 attached to be freely attachable to and detachable from feeder base 15, and includes tape passage 32, tape feed sprocket 33, and control unit 34 on the inside of main body portion 31. A rotation operation of tape feed sprocket 33 is controlled by control unit 34.

When setting carrier tape 17 in manual load feeder 16A, operator OP manually feeds carrier tape 17 into tape passage 32 after inserting a tip head portion of carrier tape 17 from tape inlet 31G provided at a rear end of main body portion 31. In addition, operator OP engages feed holes 24 of the tip head portion of carrier tape 17 with outer circumferential teeth of component feed sprocket 33 after positioning carrier tape 17 which protrudes upward from an upper portion of a middle portion of main body portion 31 above component feed sprocket 33.

Figure 6:
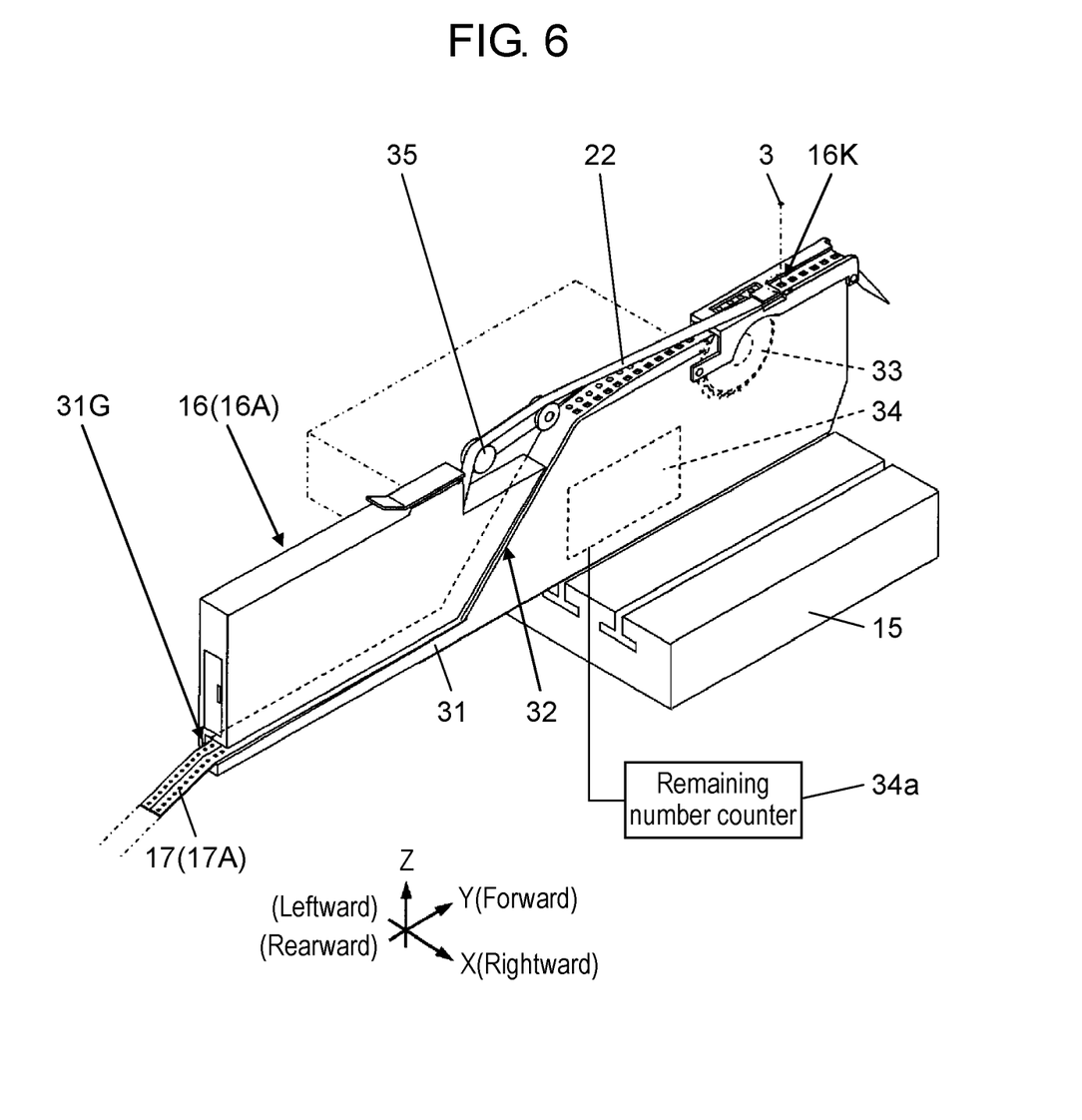
FIG. 6 is a perspective view of a manual load feeder included in the component mounter in one exemplary embodiment of the disclosure.

When positioning carrier tape 17 which protrudes out from the upper portion of the middle portion of main body portion 31 above component feed sprocket 33, operator OP allows the tip head portion of peeled cover tape 22 to bridge over cover tape winder 35 provided in the upper portion of the middle portion of main body portion 31 after peeling off the tip head portion of cover tape 22 from base tape 21 (FIG. 6). Accordingly, loading of carrier tape 17 is completed.

After the loading of carrier tape 17 is completed, when control unit 34 pitch-rotates tape feed sprocket 33, carrier tape 17 is pitch-fed in tape passage 32, and component accommodation portions 23 provided in carrier tape 17 are intermittently positioned in component supply ports 16K. In addition, cover tape winder 35 winds cover tape 22 in synchronization with the pitch-feeding of carrier tape 17, and cover tape 22 is manually peeled off from base tape 21 at a near part of component supply port 16K. Therefore, a state where component accommodation portion 23 is open upward at component supply port 16K is achieved, and suction nozzle 13N can pick up component 3 at component supply port 16K.

In addition to component feed sprocket 33, auto load feeder 16B includes loading sprocket 36 and intermediate sprocket 37. Rotation operations of loading sprocket 36 and intermediate sprocket 37 are controlled by control unit 34 similar to component feed sprocket 33.

When operator OP inserts the tip head portion of carrier tape 17 into tape inlet 31G provided at a rear end of main body portion 31, loading sprocket 36 is controlled by control unit 34 and rotates, outer circumferential teeth are engaged with feed holes 24 of the tip head portion of carrier tape 17, and carrier tape 17 advances forward. Accordingly, when the tip head portion of carrier tape 17 reaches intermediate sprocket 37, intermediate sprocket 37 and tape feed sprocket 33 which are controlled by control unit 34 respectively rotate, and intermediate sprocket 37 and tape feed sprocket 33 respectively engage the outer circumferential teeth with feed holes 24 of carrier tape 17. Accordingly, loading of carrier tape 17 is completed.

Figure 7:
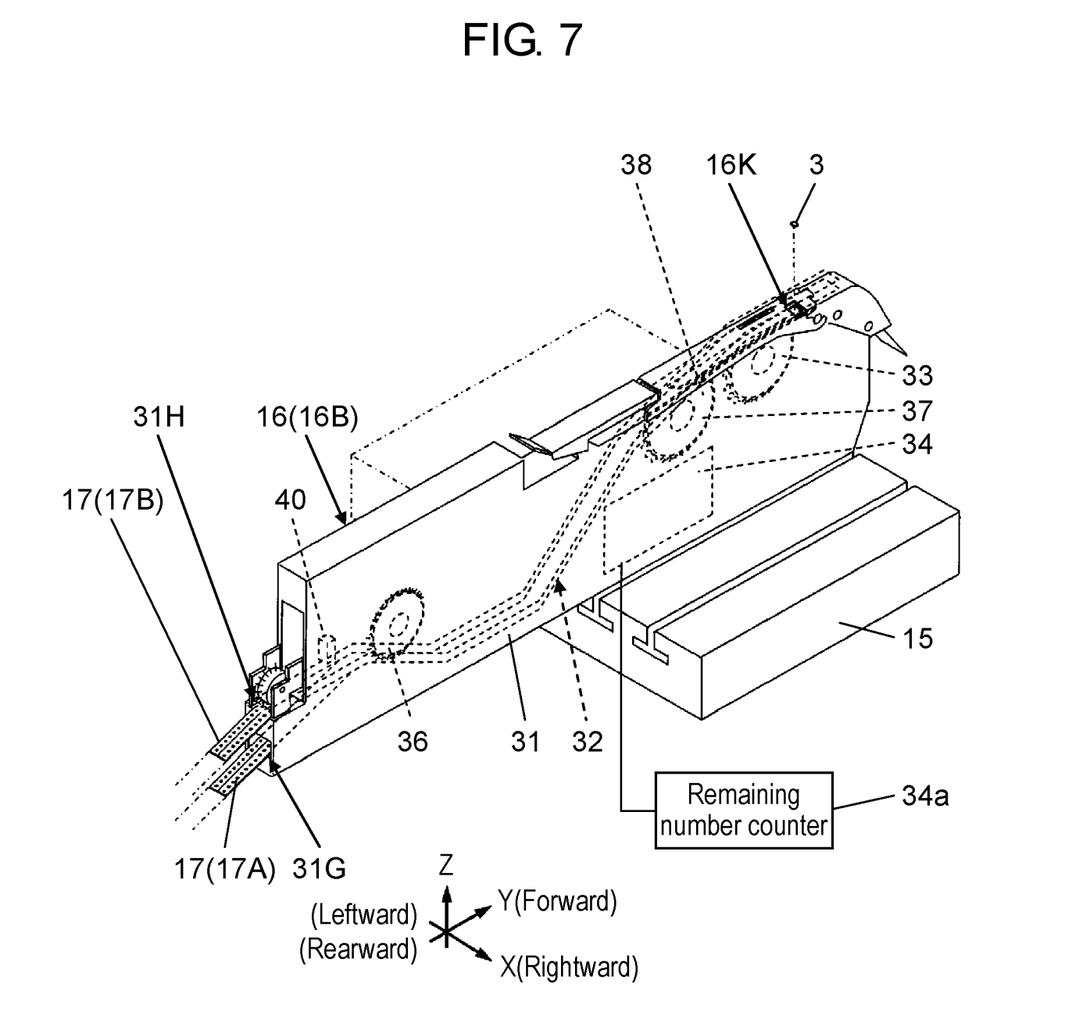
FIG. 7 is a perspective view of an auto load feeder included in the component mounter in one exemplary embodiment of the disclosure.

In FIG. 7, peeling member 38 is provided at a position between intermediate sprocket 37 and component feed sprocket 33. A blade tip of peeling member 38 is oriented toward an upstream side (obliquely lower rear part) along carrier tape 17. The blade tip of peeling member 38 is positioned between base tape 21 and cover tape 22 of carrier tape 17 fed to component feed sprocket 33 from intermediate sprocket 37. Therefore, while carrier tape 17 is fed to tape feed sprocket 33 from intermediate sprocket 37, cover tape 22 is peeled off from base tape 21. Accordingly, at the time when component accommodation portion 23 has reached component supply port 16K, the cover by cover tape 22 disappears, and suction nozzle 13N can pick up component 3 at component supply port 16K.

In FIGS. 6 and 7, control unit 34 of each of manual load feeder 16A and auto load feeder 16B includes remaining number counter 34a which functions as a remaining number detector. Remaining number counter 34a detects data about the number of components which is read at the time when carrier tape 17 is loaded, and the remaining number of components 3 accommodated in carrier tape 17 based on the number of times of pitch-feeding after the loading.

In auto load feeder 16B illustrated in FIG. 7, when replenishing following carrier tape 17 (refer to following tape 17B) in a state where termination portion 17E of carrier tape 17 (referred to as previous tape 17A) which is currently being pitch-fed has not reached tape inlet 31G yet, operator OP inserts the tip head portion of following tape 17B into tape replenishing port 31I1 provided above tape inlet 31G which is at the rear end portion of main body portion 31. Then, following tape 17B waits until termination portion 17E of previous tape 17A is drawn into main body portion 31 from tape inlet 31G, is drawn into main body portion 31 from tape replenishing port 31I1, and is loaded. In addition, in main body portion 31 of auto load feeder 16B, tape insertion sensor 40 (FIG. 7) which senses a case where carrier tape 17 is inserted into tape replenishing port 31I1 is provided.

In FIG. 1, each operation of conveyor 12, component transfer mechanism 13, and each of tape feeders 16 is controlled by control device 50 included in component mounter 1. Touch panel 51 is connected to control device 50, and operator OP can perform a required input with respect to control device 50 through touch panel 51. In addition, control device 50 performs various types of instructions or notifications with respect to operator OP through touch panel 51. In addition, an instruction with respect to operator OP may be performed through a notifier (not illustrated) included in tape feeder 16.

In component mounter 1 illustrated in FIG. 1, head moving mechanism 13b is controlled by control device 50 and allows transfer head 13a to reciprocate between tape feeder 16 and board 2. In the reciprocation, transfer head 13a suctions and picks up component 3 supplied by tape feeder 16 by suction nozzle 13N, transfers component 3 onto board 2, and manufactures a mounting board.

In FIG. 1, control device 50 of component mounter 1 includes storage 50a, detector 50b, determiner 50c, and notification controller 50d. Storage 50a stores information related to tape feeder 16 and information related to carrier tape 17 pitch-fed by tape feeder 16.

Figure 8:
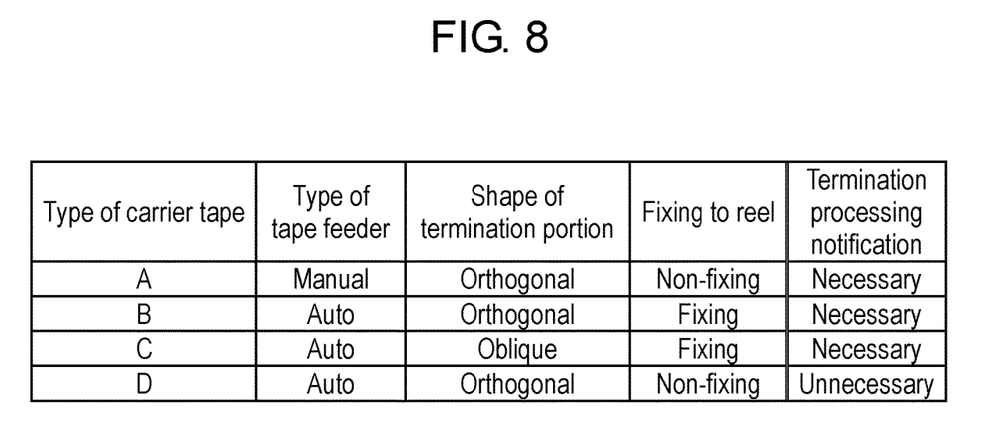
FIG. 8 is a view illustrating one example of information stored in a storage included in the component mounter in one exemplary embodiment of the disclosure.

FIG. 8 illustrates an example of information stored in storage 50a. In FIG. 8, regarding four types of carrier tapes 17, such as A, B, C, and D, which are attached to component mounter 1, various types of information, such as which type the load type is (whether manual load feeder 16A or auto load feeder 16B), which shape termination portion 17E of carrier tape 17 has (whether the orthogonal shape or the oblique shape), and which fixed state reel 18 is in (whether termination portion 17E is fixed or non-fixed to shaft portion 18J of reel 18) are stored. Each type of information stored in storage 50a is information input from an input portion, such as touch panel 51 or the like, in advance and set, and each type of information can also be corrected after the setting. In addition, in FIG. 8, items regarding each of carrier tapes 17 are set, but each information regarding each of components 3 may be stored, or each information in a form determined by a supply source company of component 3 or the type of component 3 may be stored.

In this manner, in the exemplary embodiment, information about whether or not tape feeder 16 is a type which automatically loads carrier tape 17 inserted into tape inlet 31G, is included in the information of tape feeder 16 stored in storage 50a, and information about the shape of termination portion 17E of carrier tape 17 or whether or not termination portion 17E of carrier tape 17 is fixed to reel 18 around which carrier tape 17 is wound, is included in the information of carrier tape 17 stored in storage 50a.

In FIG. 1, the remaining number of components 3 of carrier tape 17 detected by remaining number counter 34a of each of tape feeder 16 is sent to control device 50 of component mounter 1. Detector 50b of control device 50 compares the remaining number of components 3 sent from remaining number counter 34a of each of tape feeders 16 with the predetermined remaining number (referred to as the reference remaining number) determined in advance, and detects a state where carrier tape 17 is close to a component shortage by sensing a state where the remaining number of components 3 is reduced to the reference remaining number.

In a case where carrier tape 17 which is close to the component shortage is detected in this manner, control device 50 generates an alarm with respect to operator OP through touch panel 51 as a notification that it is necessary to replenish component 3 (that is, replenish following tape 17B) with respect to tape feeder 16 which pitch-feeds carrier tape 17. Specifically, tape feeder 16 which is close to the component shortage is specified, a display having a content that it is necessary to replenish carrier tape 17 with respect to tape feeder 16 is displayed on touch panel 51.

Determiner 50c of control device 50 determines whether to perform predetermined processing (termination processing) with respect to termination portion 17E of carrier tape 17 which is close to the component shortage based on information related to tape feeder 16 and information related to carrier tape 17 which are stored in storage 50a, in a case where a state where carrier tape 17 is close to the component shortage is detected by detector 50b, with respect to any of the plurality of tape feeders 16.

Figure 9A:
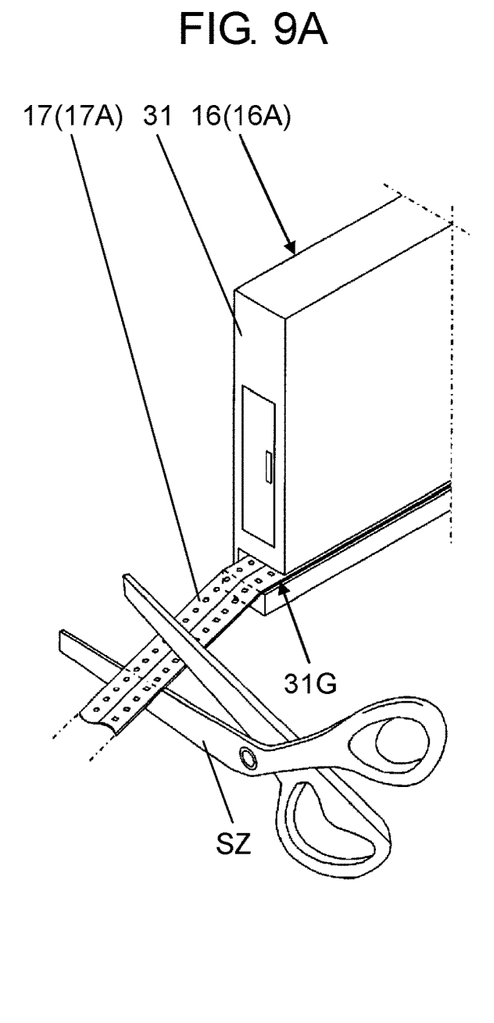
FIG. 9A is an explanation view of an order of work of cutting a previous tape pitch-fed by the manual load feeder in one exemplary embodiment of the disclosure.
Figure 9B:
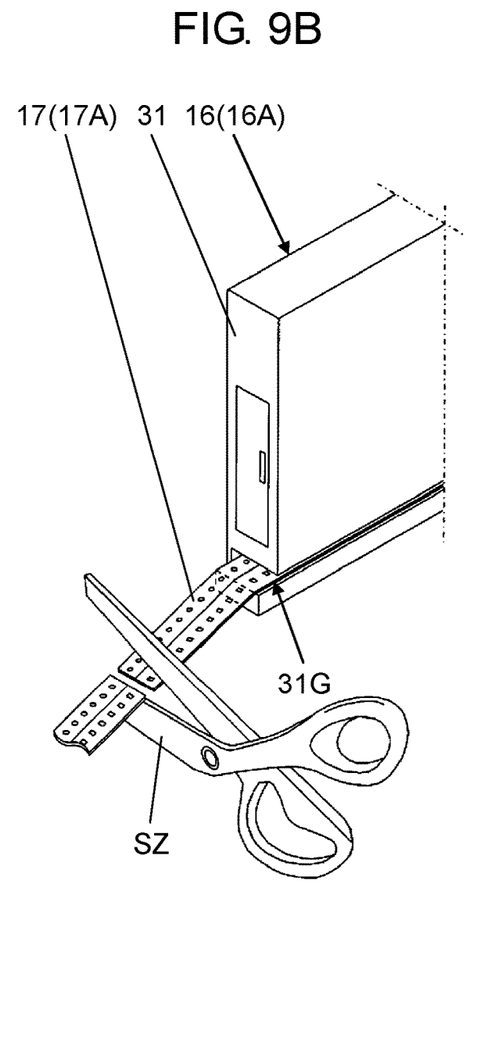
FIG. 9B is an explanation view of an order of work of cutting the previous tape pitch-fed by the manual load feeder in one exemplary embodiment of the disclosure.

Here, "termination processing" is processing for smoothly performing the replenishment of carrier tape 17, and indicates cutting work and fixing releasing work of previous tape 17A which is currently being pitch-fed. The cutting work is work of performing cutting such that a part of an appropriate location (specifically, a location positioned further rearward than the rear end component positioned at the rear end of the row of components 3 accommodated in carrier tape 17) of previous tape 17A has an orthogonal shape by scissors SZ or the like in a case where the shape of termination portion 17E of the previous tape 17A is not an orthogonal shape (FIG. 9A to FIG. 9B). In addition, the fixing releasing work is work of releasing the fixing and separating the termination portion 17E of the carrier tape 17 from shaft portion 18J of reel 18 in a case where the termination portion of previous tape 17A is fixed to shaft portion 18J of reel 18 by adhesive tape NT or the like (FIG. 3B to FIG. 3A, or FIG. 5B to FIG. 5A).

In the example of FIG. 8, since tape feeder 16 of "A" is manual load feeder 16A, and it is necessary to cut a near part of termination portion 17E of previous tape 17A when replenishing following tape 17B, regardless of the shape of termination portion 17E and the fixed state to reel 18, it becomes necessary to perform the termination processing. Determiner 50c determines that the termination processing is supposed to be performed with respect to tape feeder 16 of "A" (refer to the column "termination processing notification" in a tale of FIG. 8).

Tape feeder 16 of "B" is auto load feeder 16B, and termination portion 17E of carrier tape 17 has the orthogonal shape, but since tape feeder 16 is fixed to reel 18, work of separating termination portion 17E from reel 18 is necessary. Therefore, determiner 50c determines that the termination processing is supposed to be performed with respect to tape feeder 16 of "B" (refer to the column "termination processing notification" in the table of FIG. 8).

Tape feeder 16 of "C" is auto load feeder 16B, and it is necessary that termination portion 17E of carrier tape 17 has the orthogonal shape, but since termination portion 17E has the oblique shape here, it is necessary to cut tape feeder 16 into the orthogonal shape. Therefore, determiner 50c determines that the termination processing is supposed to be performed with respect to tape feeder 16 of "C". Tape feeder 16 of "D" is auto load feeder 16B, and, and since termination portion 17E of carrier tape 17 has an orthogonal shape, and auto load feeder 16B is non-fixed to reel 18, it is not necessary that operator OP particularly adjust previous tape 17A. Accordingly, determiner 50c determines that it is not necessary to perform the termination processing with respect to carrier tape 17 of "D" (refer to the column of "termination processing notification" in the table of FIG. 8).

Notification controller 50d of control device 50 notifies operator OP of contents of the termination processing which is supposed to be performed with respect to termination portion 17E of carrier tape 17, by displaying the contents of the termination processing on touch panel 51, in a case where determiner 50c determines that the termination processing is supposed to be performed with respect to termination portion 17E of carrier tape 17.

Figure 11:
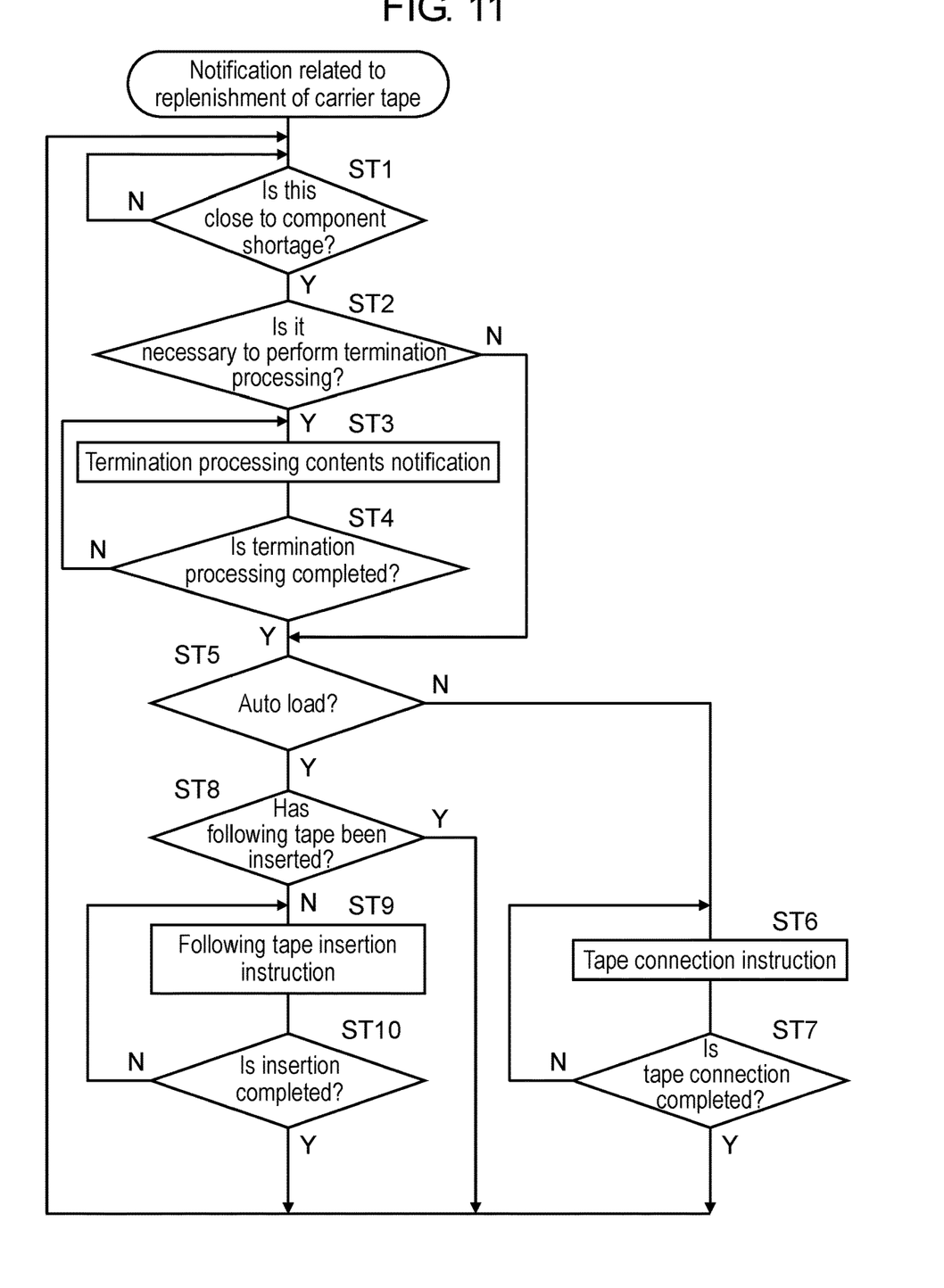
FIG. 11 is a flowchart illustrating a flow of notification processing related to replenishment of the carrier tape to be performed by the component mounter in one exemplary embodiment of the disclosure.

Next, a flow of notification processing related to the replenishment of carrier tape 17 to be performed by control device 50 of component mounter 1 will be described by using a flowchart of FIG. 11. Control device 50 detects a state where carrier tape 17 is close to the component shortage with respect to each of tape feeders 16 based on the remaining number of components of carrier tape 17 sent from remaining number counter 34a of each of tape feeders 16, in detector 50b (step ST1).

In step ST1, control device 50 determines whether or not the termination processing is supposed to be performed with respect to carrier tape 17 of tape feeder 16 as described above based on the contents of the information stored in storage 50a, in a case where a state where carrier tape 17 is close to the component shortage is detected with respect to any of the plurality of tape feeders 16 (step ST2). In addition, control device 50 notifies operator OP of the contents of the termination processing which is supposed to be performed by operator OP through touch panel 51, in a case where it is determined that the termination processing is supposed to be performed with respect to carrier tape 17 which is close to component shortage (step ST3).

In this manner, notification controller 50d of control device 50 and touch panel 51 function as a notifier which notifies operator OP of the contents of the termination processing which is supposed to be performed with respect to termination portion 17E of carrier tape 17, in a case where determiner 50c determines that the predetermined processing (termination processing) is supposed to be performed with respect to termination portion 17E of carrier tape 17.

Operator OP who has received the notification in step ST3 performs the termination processing of the notified contents. Specifically, in a case of having received the notification of instruction having a content that previous tape 17A is supposed to be cut through touch panel 51, operator OP performs the cutting such that a part of an appropriate location (as described above, a location positioned further rearward than the rear end component positioned at the rear end of the row of components 3 accommodated in carrier tape 17) of previous tape 17A has an orthogonal shape by scissors SZ or the like (FIG. 9A to FIG. 9B). In addition, in a case of having received the instruction having a content that termination portion 17E of previous tape 17A is supposed to be separated from reel 18 through touch panel 51, operator OP performs work of separating termination portion 17E of previous tape 17A from shaft portion 18J of reel 18 (FIG. 3B to FIG. 3A, or FIG. 5B to FIG. 5A). In addition, when the termination processing work is completed, operator OP performs a predetermined termination processing completion operation from touch panel 51. In addition, until the termination processing completion operation is performed, the pitch-feeding of previous tape 17A may be stopped. By stopping the pitch-feeding of carrier tape 17, operator OP can more easily perform the termination processing.

When it is sensed that operator OP has performed the termination processing completion operation from touch panel 51 (step ST4), control device 50 determines whether or not tape feeder 16 which is determined to be close to the component shortage in step ST1 is auto load feeder 16B (step ST5). In addition, in a case where tape feeder 16 which is determined to be close to the component shortage is not auto load feeder 16B (but manual load feeder 16A), the instruction having a content that following tape 17B is supposed to be connected is displayed on touch panel 51 (step ST6).

Figure 10A:
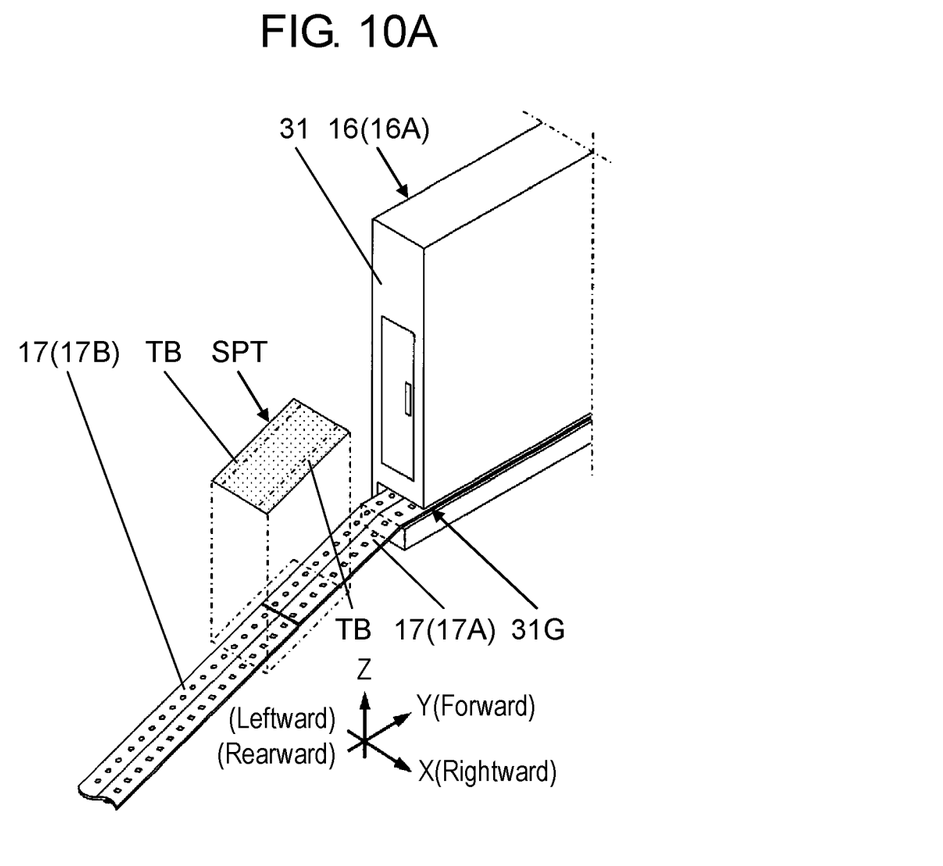
FIG. 10A is an explanation view of an order of work of connecting a following tape to the previous tape pitch-fed by the manual load feeder in one exemplary embodiment of the disclosure.
Figure 10B:
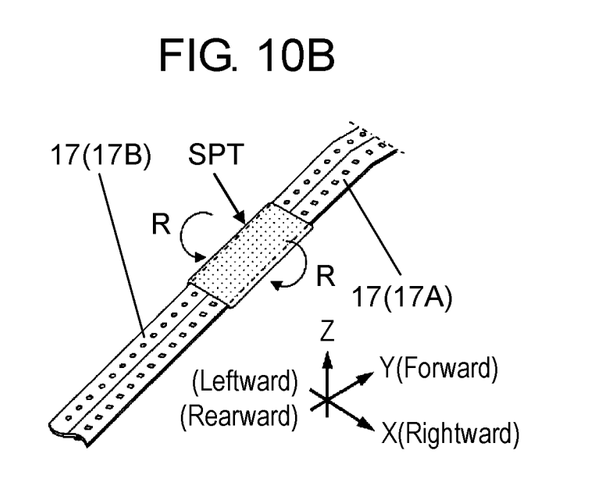
FIG. 10B is an explanation view of an order of work of connecting the following tape to the previous tape pitch-fed by the manual load feeder in one exemplary embodiment of the disclosure.

When the instruction having a content that following tape 17B is supposed to be connected is displayed on touch panel 51, operator OP performs work of connecting following tape 17B to previous tape 17A according to the displayed instruction. In the work of connecting following tape 17B, first, operator OP allows the tip head portion of following tape 17B to face termination portion 17E of previous tape 17A cut into the orthogonal shape. In addition, after sticking splicing tape SPT across previous tape 17A and following tape 17B (FIG. 10A), one pair of end portions TB of splicing tape SPT is respectively bent downward (arrow R illustrated in FIG. 10B), and parts thereof stick to rear surfaces of previous tape 17A and following tape 17B (FIG. 10B).

When connecting following tape 17B to previous tape 17A according to the above-described order, operator OP performs a predetermined connection completion operation from touch panel 51. When it is sensed that operator OP has performed the connection completion operation from touch panel 51 (step ST7), control device 50 returns the process to step ST1 considering that a series of processing is finished.

Meanwhile, in step ST5, in a case where it is determined that tape feeder 16 which is a target is auto load feeder 16B, control device 50 performs determination about whether or not following tape 17B is inserted into tape replenishing port 31H of tape feeder 16 (auto load feeder 16B) which is a target (step ST8). It is possible to sense whether or not following tape 17B is inserted into tape replenishing port 31H by the above-described tape insertion sensor 40.

Here, a case where following tape 17B is inserted into tape replenishing port 31H is a case where operator OP willingly inserts following tape 17B into tape replenishing port 31H before a state where previous tape 17A is close to the component shortage is achieved. In step ST8, in a case where it is determined that following tape 17B has been already inserted into tape replenishing port 31H of tape feeder 16 which is in a state of being close to the component shortage, control device 50 returns the process to step ST1 considering that a series of processing is finished.

In step ST8, in a case where it is determined that following tape 17B is not inserted into tape replenishing port 31H, control device 50 displays the instruction having a content that following tape 17B is supposed to be inserted into tape replenishing port 31H on touch panel 51 (step ST9). When the instruction having a content that following tape 17B is supposed to be inserted is displayed on touch panel 51, similar to a case when carrier tape 17 is newly loaded, operator OP inserts the tip head portion of following tape 17B into tape inlet 31G of tape feeder 16 (FIG. 7). In addition, in a case where it is sensed that the insertion work of following tape 17B by operator OP is completed by tape insertion sensor 40 (step ST10), control device 50 returns the process to step ST1 considering that a series of processing is finished.

As described above, component mounter 1 in the exemplary embodiment includes tape feeder 16 which pitch-feeds carrier tape 17 and supplies component 3. In addition, component mounter 1 includes storage 50a, detector 50b, determiner 50c, and the notifier. Storage 50a stores the information related to tape feeder 16 and the information related to carrier tape 17 pitch-fed by the tape feeder 16. Detector 50b detects a state where carrier tape 17 pitch-fed by tape feeder 16 becomes close to a component shortage. Determiner 50c determines whether to perform the predetermined processing with respect to the termination portion of carrier tape 17 to be pitch-fed by tape feeder 16 based on the information related to the tape feeder 16 and the information related to carrier tape 17 which are stored in storage 50a, in a case where a state where carrier tape 17 pitch-fed by tape feeder 16 is close to the component shortage is detected by detector 50b. The notifier notifies operator OP of the contents of the predetermined processing, in a case where determiner 50c determines that the predetermined processing is supposed to be performed with respect to termination portion 17E of carrier tape 17.

As described above, in component mounter 1 in the exemplary embodiment, in a case where the information related to tape feeder 16 and the information related to carrier tape 17 pitch-fed by tape feeder 16 are stored, and a state where carrier tape 17 pitch-fed by tape feeder 16 is close to the component shortage is detected, based on the information related to the tape feeder 16 and the information related to carrier tape 17 which are stored, it is determined whether or not the predetermined processing (termination processing) is performed with respect to termination portion 17E of carrier tape 17 pitch-fed by tape feeder 16. In addition, in a case where it is determined that the termination processing is supposed to be performed with respect to termination portion 17E of carrier tape 17, the contents of the termination processing which is supposed to be performed with respect to termination portion 17E of carrier tape 17 is notified to operator OP.

Therefore, according to component mounter 1 in the exemplary embodiment, in a case where carrier tape 17 pitch-fed by tape feeder 16 is close to the component shortage, and in a case where it is necessary to perform the termination processing with respect to termination portion 17E of carrier tape 17, the contents of the termination processing is notified. Therefore, when performing the replenishment of following tape 17B, it is not necessary that operator OP him or herself determines which termination processing is supposed to be performed with respect to previous tape 17A, and it is possible to largely reduce the workload of operator OP with respect to the termination processing of carrier tape 17.

In the above-described exemplary embodiment, as detector 50b of control device 50 senses a state where the remaining number of components 3 of carrier tape 17 is reduced to the predetermined remaining number, a state where carrier tape 17 (previous tape 17A) is close to the component shortage is detected, but instead of the configuration, by sensing a state where the rear end component positioned at the rear end of the row of components 3 accommodated in carrier tape 17 has passed through a predetermined position of tape feeder 16 by a component sensor or the like provided at the predetermined position, or by sensing a state where the remaining length of carrier tape 17 calculated from the remaining number of components or the like is shorter than the predetermined length, a state where carrier tape 17 is close to the component shortage may be detected.

In addition, in the above-described exemplary embodiment, a configuration in which functional portions, such as storage 50a, detector 50b, determiner 50c, and notification controller 50d, are included in control device 50 of component mounter 1 is employed, but in a case where a host computer or the like linked to component mounter 1 exists, the entirety or a part of the above-described functional portions may be provided in the host computer. In this case, not only component mounter 1 but also systems including the host computer correspond to the component mounting system of the disclosure.

In addition, in the above-described exemplary embodiment, operator OP performs the predetermined termination processing completion operation from touch panel 51, but instead of the input from touch panel 51, the operation may be performed from the input portion (not illustrated) provided in tape feeder 16. Otherwise, in a case where operator OP carries or the like a terminal that reads the information of reel 18, the termination processing completion operation may be input from the terminal, or an operation of newly reading the information of reel 18 using the terminal may be considered as the termination processing completion operation.

What is claimed is:

1. A component mounting system including a tape feeder that pitch-feeds a carrier tape and supplies components, comprising:
   a storage which stores information related to the tape feeder and information related to the carrier tape pitch-fed by the tape feeder, the information related to the tape feeder including whether the tape feeder is a manual load feeder or an auto load feeder, the information related to the carrier tape including whether a termination portion of the carrier tape is fixed or not fixed to a reel around which the carrier tape is wound;
   a detector which detects a state where the carrier tape pitch-fed by the tape feeder becomes close to a component shortage;
   a determiner which determines whether termination processing is necessary for a termination portion of the carrier tape based on the information related to the tape feeder and the information related to the carrier tape upon detection by the detector that the carrier tape is close to a component shortage; and
   a notifier which notifies an operator of contents of the termination processing, in a case where the determiner determines that the termination processing is necessary for the termination portion of the carrier tape,
   wherein the determiner determines that termination processing is not necessary when the tape feeder is an auto load feeder and the termination portion of the carrier tape is not fixed to the reel around which the carrier tape is wound.

2. The component mounting system according to claim 1, wherein information about whether a shape of the termination portion of the carrier tape is orthogonal or oblique is included in the information related to the carrier tape stored in the storage.

3. The component mounting system according to claim 1, wherein the detector detects a state where the carrier tape is close to a component shortage by sensing any of a state where a remaining number of the components of the carrier tape is reduced to a predetermined remaining number and a state where a remaining length of the carrier tape is shorter than a predetermined length.

4. The component mounting system according to claim 1, wherein the determiner determines that termination processing is necessary when the tape feeder is a manual load feeder and the termination portion of the carrier tape is not fixed to the reel around which the carrier tape is wound.

5. The component mounting system according to claim 1, wherein the determiner determines that termination processing is necessary when the tape feeder is an auto load feeder and the termination portion of the carrier tape is fixed to the reel around which the carrier tape is wound.

* * * * *